(12) United States Patent
Smith et al.

(10) Patent No.: US 9,997,598 B2
(45) Date of Patent: Jun. 12, 2018

(54) THREE-DIMENSIONAL SEMICONDUCTOR DEVICE AND METHOD OF FABRICATION

(71) Applicant: TOKYO ELECTRON LIMITED, Minato-ku (JP)

(72) Inventors: Jeffrey Smith, Clifton Park, NY (US); Anton deVilliers, Clifton Park, NY (US); Nihar Mohanty, Clifton Park, NY (US); Subhadeep Kal, Albany, NY (US); Kandabara Tapily, Mechanicville, NY (US)

(73) Assignee: Tokyo Electron Limited, Minato-ku (JP)

( * ) Notice: Subject to any disclaimer, the term of this patent is extended or adjusted under 35 U.S.C. 154(b) by 0 days. days.

(21) Appl. No.: 15/671,771

(22) Filed: Aug. 8, 2017

(65) Prior Publication Data

US 2018/0040695 A1   Feb. 8, 2018

Related U.S. Application Data

(60) Provisional application No. 62/372,106, filed on Aug. 8, 2016.

(51) Int. Cl.
| | |
|---|---|
| *H01L 29/06* | (2006.01) |
| *H01L 29/423* | (2006.01) |
| *H01L 27/11* | (2006.01) |
| *H01L 21/8238* | (2006.01) |

(52) U.S. Cl.
CPC .. *H01L 29/0676* (2013.01); *H01L 21/823871* (2013.01); *H01L 21/823878* (2013.01); *H01L 27/1104* (2013.01); *H01L 29/0649* (2013.01); *H01L 29/42392* (2013.01)

(58) Field of Classification Search
CPC ......... H01L 29/0676; H01L 21/823871; H01L 21/823878; H01L 27/1104; H01L 29/0649; H01L 29/42392
See application file for complete search history.

(56) References Cited

U.S. PATENT DOCUMENTS

| | | |
|---|---|---|
| 2012/0007052 A1 | 1/2012 | Hobbs et al. |
| 2013/0161756 A1 | 6/2013 | Glass et al. |
| 2013/0270512 A1* | 10/2013 | Radosavljevic .. H01L 21/82382 257/9 |
| 2015/0228652 A1 | 8/2015 | Cheng et al. |

OTHER PUBLICATIONS

International Search Report and Written Opinion of the International Searching Authority dated Oct. 25, 2017 in PCT/US17/45864 filed Aug. 8, 2017.

* cited by examiner

*Primary Examiner* — Karen Kusumakar

(74) *Attorney, Agent, or Firm* — Oblon, McClelland, Maier & Neustadt, L.L.P.

(57) ABSTRACT

A semiconductor device including a substrate and a gate region of a field effect transistor formed on the substrate. The gate region includes vertically stacked nanowires having longitudinal axes that extend parallel with a working surface of the substrate. A given stack of vertically stacked nanowires includes at least two nanowires vertically aligned in which a p-type nanowire and an n-type nanowire are spatially separated from each other vertically. The semiconductor device further includes a step-shaped connecting structure formed within the gate region that electrically connects each nanowire to positions above the gate region. A first gate electrode has a step-shaped profile and connects to a first-level nanowire.

20 Claims, 13 Drawing Sheets

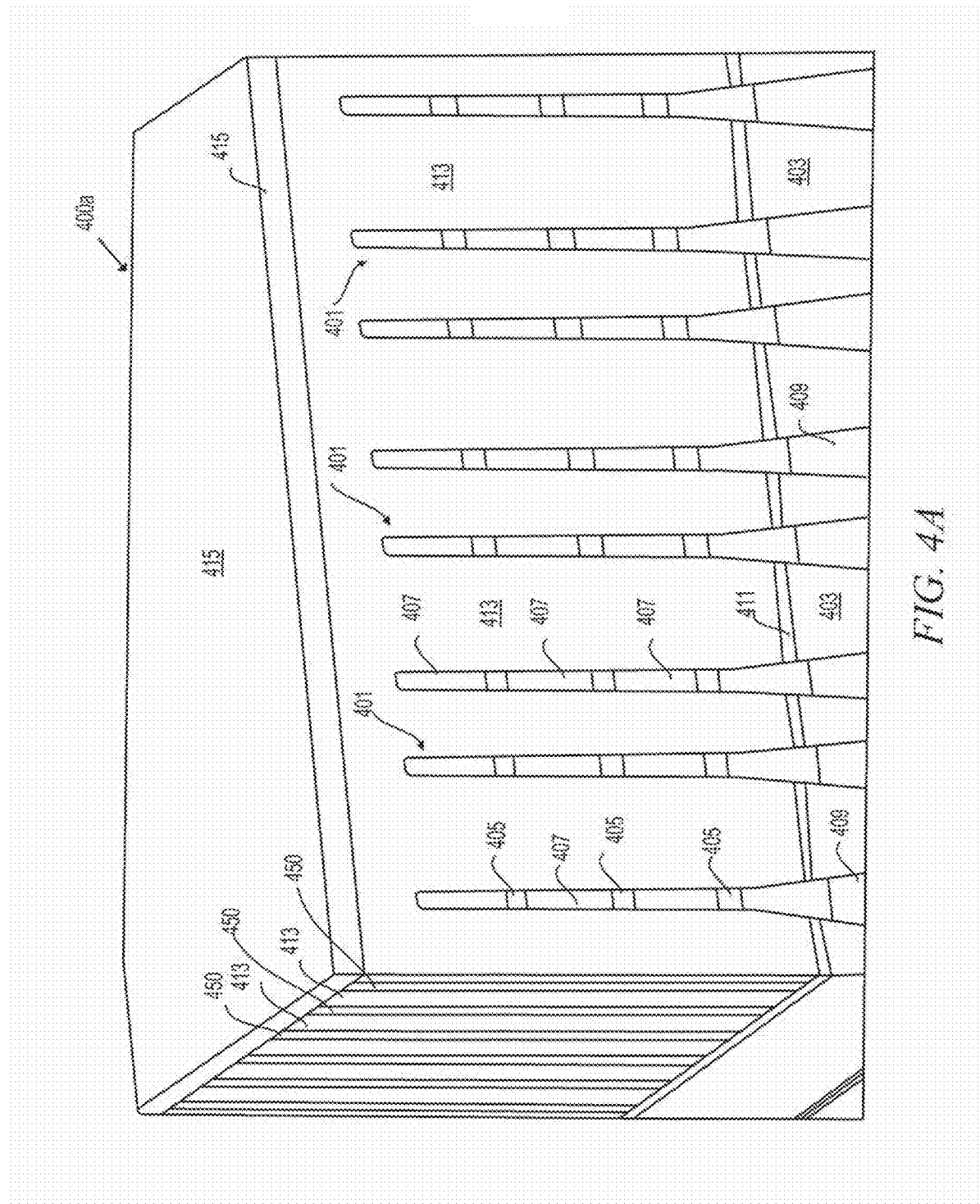

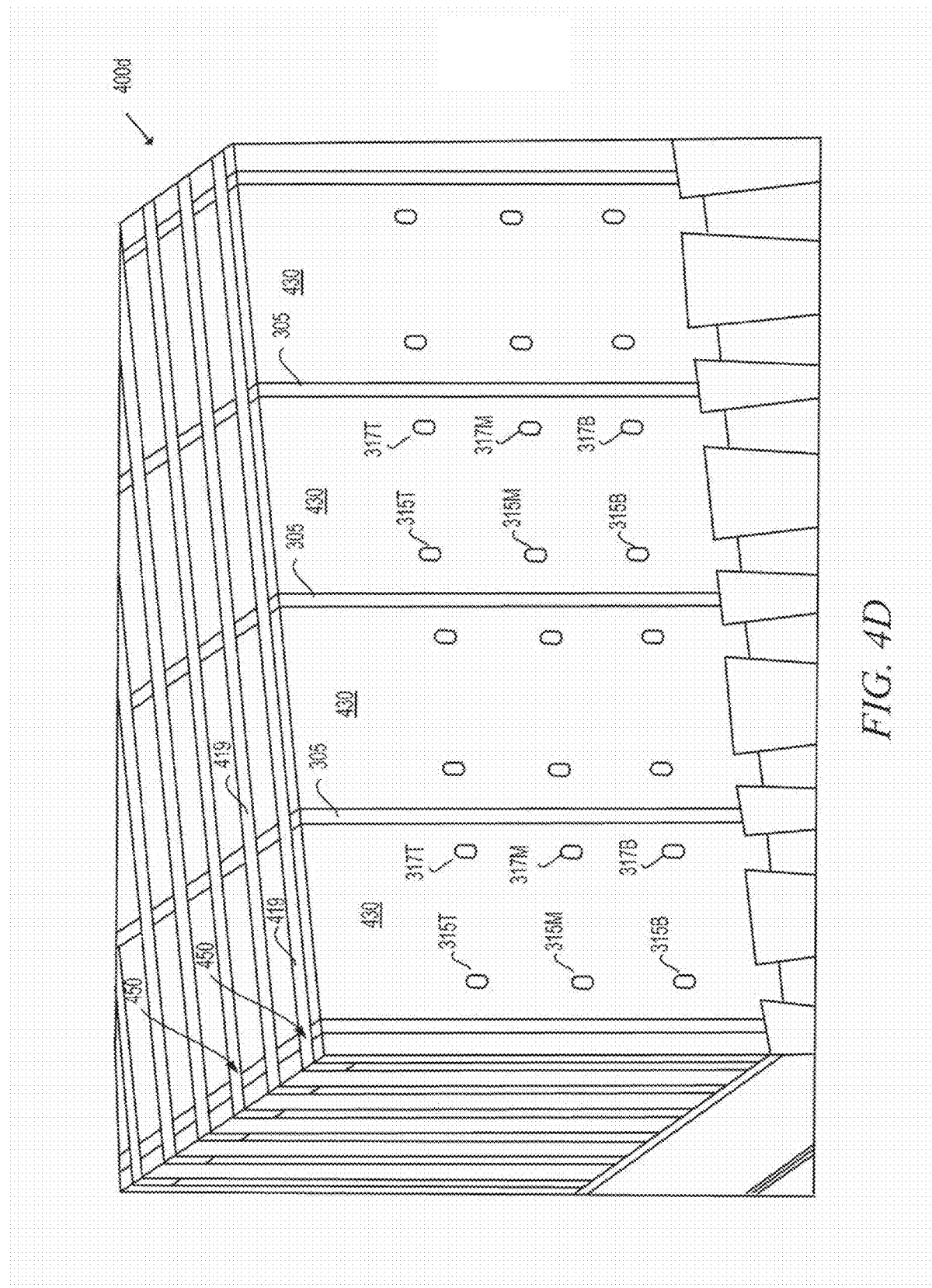

THREE-DIMENSIONAL SEMICONDUCTOR DEVICE AND METHOD OF FABRICATION

CROSS REFERENCE TO RELATED APPLICATIONS

This application is based on, and claims the benefit of priority to, U.S. provisional application No. 62/372,106 filed Aug. 8, 2016, the entire contents of which is incorporated herein by reference.

FIELD OF THE DISCLOSURE

The present invention relates to a semiconductor device and a method of manufacturing a semiconductor device such as an integrated circuit, and to manufacturing transistors and transistor components for an integrated circuit.

DESCRIPTION OF RELATED ART

In the manufacture of a semiconductor device (especially on the microscopic scale), various fabrication processes are executed such as film-forming depositions, etch mask creation, patterning, material etching and removal, and doping treatments. These processes are performed repeatedly to form desired semiconductor device elements on a substrate. Historically, with microfabrication, transistors have been created in one plane, with wiring/metallization formed above the active device plane, and have thus been characterized as two-dimensional (2D) circuits or 2D fabrication. Scaling efforts have greatly increased the number of transistors per unit area in 2D circuits, yet scaling efforts are running into greater challenges as scaling enters single digit nanometer semiconductor device fabrication nodes. Semiconductor device fabricators have expressed a desire for three-dimensional (3D) semiconductor circuits in which transistors are stacked on top of each other.

SUMMARY

Accordingly, one object of the present disclosure is to facilitate manufacturing of 3D semiconductor circuits.

This and other objects of the disclosure may be provided by a three dimensional (3-D) integrated circuit (IC) or semiconductor device including a substrate and a gate region of a field effect transistor formed on the substrate. The gate reason includes vertically stacked nanowires having longitudinal axes that extend parallel with a working surface of the substrate. A given stack of vertically stacked nanowires includes at least two nanowires vertically aligned in which a p-type nanowire and an n-type nanowire are spatially separated from each other vertically. The semiconductor device further includes a step-shaped connecting structure formed within the gate region that electrically connects each nanowire to positions above the gate region. A first gate electrode has a step-shaped profile and connects to a first-level nanowire.

In another aspect, a method of forming a semiconductor device includes forming nanowires extending through a gate region of a field-effect transistor device, forming a horizontal barrier layer between two vertically separated nanowires within the gate region, the gate region having a temporary fill material covering a first-level nanowire the temporary fill material having a horizontal surface extending between the first-level nanowire and a second-level nanowire, the second-level nanowire positioned above the first level-nanowire and vertically aligned with the first-level nanowire, the horizontal barrier being formed by selectively depositing barrier material on the temporary surface without depositing barrier material on the second-level nanowire. A vertical electrode barrier is formed extending to the horizontal barrier; and a first gate electrode and a second gate electrode are formed within the gate region, with each gate electrode electrically connecting a nanowire to a contact location above the gate region. The first gate electrode has a step-shaped profile, the first and second gate electrode being separated from each other by at least the horizontal barrier and the vertical electrode barrier.

Still another aspect includes a method of forming a semiconductor device, including forming a gate region having a vertical stack of nanowires that includes at least two nanowires with longitudinal axes oriented horizontally and with the nanowires being spaced apart from each other and aligned vertically. A process sequence is executed including depositing temporary fill material in the gate region, recessing the temporary fill material to a location in between vertically stacked nanowires and forming a horizontal barrier material by selectively depositing on the temporary fill material without depositing on uncovered nanowires. The sequence further includes forming vertical barriers, selectively metallizing nanowires; and forming first and second gate electrodes by depositing metal within spaces defined by the horizontal barrier and vertical barriers.

Of course, the order of discussion of the different steps as described herein has been presented for clarity sake. In general, these steps can be performed in any suitable order. Additionally, although each of the different features, techniques, configurations, etc. herein may be discussed in different places of this disclosure it is intended that each of the concepts oars be executed independently of each other or in combination with each other. Accordingly, the present invention can be embodied and viewed in many different ways.

Note that this summary section does not specify every embodiment and/or incrementally novel aspect of the present disclosure or claimed invention. Instead, this summary only provides a preliminary discussion of different embodiments and corresponding points of novelty over conventional techniques. For additional details and/or possible perspectives of the invention and embodiments, the reader is directed to the Detailed Description section and corresponding figures of the present disclosure as further discussed below.

BRIEF DESCRIPTION OF THE DRAWINGS

FIG. 4A is a cross-sectional perspective view of an example starting structure for forming a 3D SRAM according to embodiments of the disclosure.

FIG. 4D is an example intermediate structure for forming a 3D SRAM according to embodiments of the disclosure.

FIG. 4I is an example intermediate structure for forming a 3D SRAM according to embodiments of the disclosure.

DETAILED DESCRIPTION

Techniques herein pertain to fabrication of 3D integrated circuits in which circuit devices are vertically arranged in relation to a planar surface of a substrate. According to disclosed embodiments, vertically arranged circuit devices can have electrodes formed in substantially the same plane with the respective device such that electrodes of the vertically arranged devices can be stacked or overlapped to occupy the same planar area. This can significantly improve area scaling capabilities for the integrated circuit. Techniques disclosed herein apply to stacking of active circuit devices (such as transistors), passive circuit devices (such as resistors, capacitors, inductors, etc.) or a combination of such devices into a 3D integrated circuit. Transistors may foe field effect transistor (FET) devices using a fin configuration, nanowire configuration and/or multichannel configurations, for example.

Aspects of this disclosure pertain to device fabrication using gate-all-around processing incorporating nanowires or nanosheets in a FET (field effect transistor). Gate-all-around (GAA) identifies a FET device in which a metal gate is physically wrapped around a silicon or silicon/germanium wire. GAA is a further extension of the tri-gate process of fin FETs where the gate is wrapped around a silicon or silicon/germanium fin. With fin FETs, the gate wraps around on three of four sides of a fin, while with GAA FET devices, the gate wraps around all of the channel (whether having discrete sides or a circular wall, for example). One type of a GAA FET device is a nanowire FET. GAA nanowire FETs mitigated the undesirable "short channel" effects to permit continued area scaling of FET devices.

Figure 5:
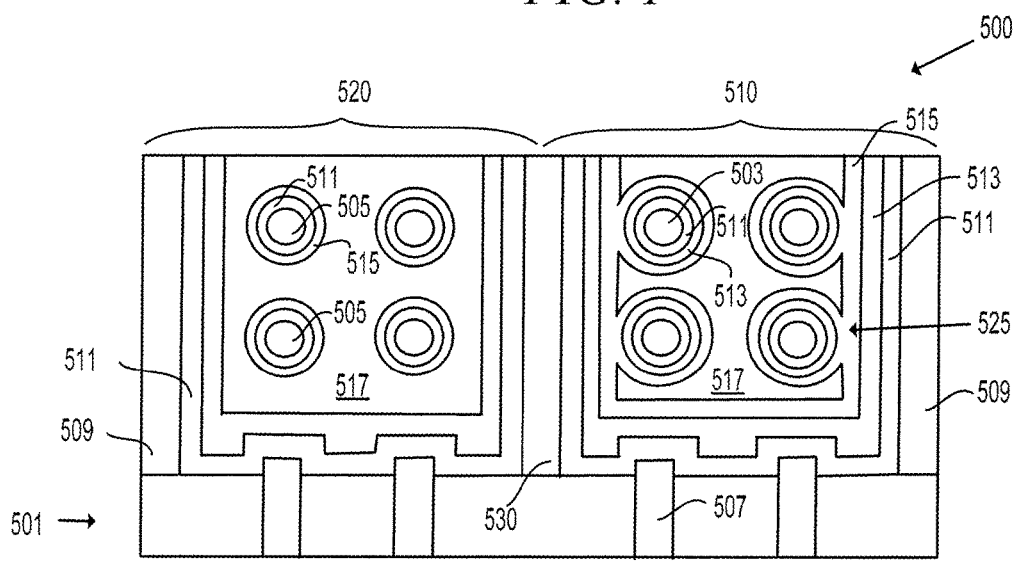
FIG. 5 is a schematic illustration of a cross-section of a complementary FET device.

Complimentary FET devices are important to both analog and digital circuits. For example, CMOS devices are integral to static random access memory (SRAM) circuits and logic gate circuits. With nanowire CMOS devices, NMOS and PMOS gate electrodes are typically isolated on either side of a logic cell where NFET and PFET nanowires run through each corresponding gate electrode. FIG. 5 is a cross-section of a gate region structure of a typical nanowire CMOS device. As seen, the structure 500 includes a substrate 501 having PMOS gate region 510 and an NMOS gate region 520 provided in side-by side relation to each other on the substrate 501. The substrate 101 includes bulk fin 507 of material remaining from an initial multilayer fin structure from which nanowires 503 and 505 are released. In the example embodiment of FIG. 5, each gate region each includes multiple nanowires (four in the example shown) which can provide a current channel region (i.e. a multi-channel region) for respective n-type and p-type devices, for example.

The gate region is bordered by isolation structures 509 which can isolate the cell structure from an adjacent cell structure. It is desirable to physically separate the NMOS and PMOS gate electrodes such as by physically cutting the gate or through transferring an isolation trench into the gate which is then filled with dielectric. Within the gate region, PMOS gate electrode section 510 and NMOS gate electrode section 520 are physically and electrically isolated from each other by a gate isolation structure 530.

As seen, the isolation structure 509 and the gate isolation structures 530 together define two gate "chambers" each containing a respective gate electrode section. After release of the nanowires from a fin structure, the wires are supported on opposing ends by gate structures such that the nanowires are suspended within the gate region. The suspended wires are processed to include a gate dielectric and gate metals around the nanowire. Thus, as seen in FIG. 5, PMOS electrode section 510 includes a Si nanowires 503 surrounded by a layer of high-K material 511, a layer of PMOS metals 513 and a layer of work function metal 515 successively formed on the PMOS nanowire 103. Similarly, the NMOS electrode section 520 includes Si nanowire 505 with high K material 511 and work function metal 515 thereon. Metal fill 517 is provided within the PMOS and NMOS gate sections respectively.

An example patterning processes to make gate structures for a complementary FET device such as that of FIG. 5 involves depositing the high-K material 511, such as hafnium oxide (HfO), onto all of the nanowires and into a gate border by means of ALD deposition. In FIG. 5, the gate border is formed by substrate 501, and isolation structures 509 and 530. Then, the NMOS wire array is blocked by filling the NMOS electrode section 520, with a material such as SiO and opening only the PMOS electrode area 510, followed by a deposition of PMOS metals 513 around the PMOS nanowires. This is followed by removal of the blocking material within the gate on the NMOS electrode side 520, and then followed by work function metal 515 deposition on all nanowires. Finally gate metal 517 is used to fill the remainder of the metal gate.

Although the addition of the physical "cut" or barrier 530 between the gate electrodes of a CMOS device is desirable, it increases the planar area of the CMOS nanowire device as seen in FIG. 5. Further, the barrier 530 has a side effect of the gate metal materials being wrapped around the inner chambers formed by the cut portion of the gate as seen in FIG. 5. Thus additional spacing may be required to ensure that the metals wrapping around the nanowire do not touch the gate chamber metals which have been deposited on the bottom of the gate where there is potential contact to the remaining bulk fin 507 from nanowire creation. This also increases the planar area of the CMOS circuit. A region where the PMOS work function metal around the PMOS nanowire is touching the gate sidewall is shown as 525 in FIG. 5.

One of the benefits of a gate-all-around or nanowire FET is that it can be used to form complementary devices in that NFET and PFET devices (and wires) can be stacked on fop of one another in order to provide significant area scaling of a logic device. As noted above, conventional circuit devices are designed such that all NFET wires are positioned at one end of the device, and all PFET wires are positioned at the opposite end of the device. In a 3D complementary FET device, the NFET and PFET wires can be stacked directly on top of one another. For example, the NFET device of FIG. 5 (having multiple NFET nanowires in vertical and horizontal arrays) can be stacked on top of the PFET device to form a stacked CMOS device. Similarly, an NFET consisting of a single nanowire can be vertically stacked on fop of a single nanowire PFET device. This stacking enables a circuit in which each nanowire has direct access to a specific terminal of the circuit device. For example, a 3-D SRAM may include an upper nanowire that can provide access to a bit-line contact in the SRAM (static random-access memory) device, a lower NFET wire can independently contact to VSS (negative supply voltage), a bottom PFET wire can independently contact to VDD (positive supply voltage), and so on.

The ability for each wire to independently contact to a specific terminal of the device provides a significant area scaling benefit. When FET devices such as nanowires are complementary stacked overtop of one another (mixing NFET wires and PFET wires), each may require an individual electrode within a gate region and within the S/D (source-drain) bar that is separated by a dielectric film to prevent capacitive charging between electrodes. The same is true with the gate region where each nanowire may need to pass through either an NMOS or PMOS gate electrode. One challenge with complementary FET structures has been with the complexity of the MOL (middle-of-line) interconnect and BEOL (back-end-of-line) metallization layers required to enable connection to individual electrodes within the S/D bar and/or gate region. For a simple SRAM where there is only a PFET and NFET wire stacked complementary on top of each other, the middle of line (MOL) and backend of line (BEOL) metal becomes quite crowded.

For example, the first via level (V-1) and the first metal layer (M0) may be used to define cross-coupling of the SRAM inverters and provide a pedestal for word line (WL) connections up to M1, and to provide VDD, VSS, bit line (BL), and BLB contacts of the SRAM up to M2. In this example, the pattern density at M0 is quite complex and requires increasing the size (footprint or horizontal area) of the SRAM cell in order to fit in the combination of cross-coupling local interconnects and pedestals for WL and VDD/VSS contacts up to M1 and M2, respectively.

When connecting, from BEOL metal down to the individual gate electrodes, the contacts may be done by patterning contacts into the necessary electrode and wrapping an inner spacer of thickness set by the dielectric needs to prevent capacitive charging between electrodes. For example, as the number of stacked lateral nanowires increases, so will the number of contacts going down to the necessary gate electrodes. For a 2 stacked wire configuration, doing such a process of making a contact down to the lower electrode is possible with added congestion in the MOL and BEOL. For a 3 stacked wire process and above, another solution is desirable to prevent further congestion and/or an increase in area scaling of the device to compensate.

Techniques herein include structuring the gate region electrodes so that these electrodes can make individual contact to BEOL metallization layers incorporating self-alignment capability to enable significant area scaling benefit associated with stacking N-MOS and PMOS wires as complimentary stacking. Techniques include overlapping "stair-cased" or step-shaped gate electrodes. A repeatable process can be done to form an increasing "step-like" progression or configuration in the gate electrodes, where each step produces a self-aligned contact which extends up to the MOL and BEOL metal. Processes can include forming electrode barriers of step-shaped electrodes, and simultaneously filling electrode channels with metal.

This device configuration and method enables each nanowire device to have an individual connection to any terminal in the circuit and as such moves much of the MOL and BEOL wiring complexity down to a much more simplistic layout where the wire separation is done through or within the gate region.

Stair-case structures have been used for 3D NAND devices where control gates are formed within a FET array and a stair-case electrode structure is established outside of the array in order to make contact to each control gate. The case of 3D NAND requires the stair-case structures to be outside of the immediate array and requires significant area to fit the stair-case on a chip. With techniques herein, however, step-shaped wiring is overlapping and formed within a gate region (and/or source-drain region) which is physically part of a 3D logic array. With this arrangement, there is little or no area scaling loss associated with building a stair-case in a device of this disclosure compared to a conventional device.

Accordingly, techniques include forming multiple electrodes within a gate region within a logic device or FET device, with the multiple electrodes being step-shaped and stacked with respect to one another within the gate to enable contact to individual wires in a stacked nanowire flow. This configuration enables NFET wires to be stacked overtop PFET wires (vertically stacked), as opposed to the conventional arrangement of having NFET and PFET wires being physically separated out on either end of the device. Stacking NFET and PFET wires enables significant area scaling of a given device. This structure can be considered as NFET wires being folded overtop the PFET wires.

Benefits of techniques herein include significant area scaling realized through enabling the stacking of NFET and PFET wires on top of each other in a complimentary FET device instead of having horizontally-separated gates, a single gate region herein contains both n-type and p-type semiconductors, with each type vertically aligned to realize area sealing.

There are various different types and configurations of FET devices. For convenience in describing embodiments herein, description will primarily focus on a complimentary FET device in which NFET over NFET over PFET wires are used to area-scale a given device. Note that techniques herein are readily applicable to any 3D logic device including programmable logic integrated circuits and other devices with repeating structures. The illustrations herein include perspective views of a 3D SRAM being fabricated to show example process flow and techniques to produce a method for forming a stair-cased or step-shaped gate electrodes that can enable local interconnection among individual wires that exist in a stacked complimentary FET structure.

Techniques disclosed herein include devices and methods that enable 3D FET logic designs by incorporating a singular gate structure that has multiple levels which can accommodate vertically stacked FET devices. For example, techniques disclosed herein include devices and methods that enable 3D complimentary FET logic designs by incorporating a singular gate structure that has multiple levels which can accommodate PMOS gate electrode, NMOS gate electrode, and even un-metalized nanowires without any gate metal wrapped around.

One benefit of complementary 3D FET devices is that through stacking NFET and PFET wires on top of one another, significant area benefit can be realized in a logic cell design, even if some type of isolation is required between the NMOS and PMOS gate electrodes. One approach to separating NMOS- and PMOS gate electrodes is either: (a)

forming a common gate and altering the logic cell design to allow for a common gate electrode, or (b) forming multiple gates in series which would allow for NMOS and PMOS gate electrode functionality, although the application of the later approach would require isolation of the NFET and PFET wires while running through all gates.

Embodiments herein enable option (b) but without a need to have gates run in series with each other. Instead, techniques herein include a gate that is comprised of both PMOS and NMOS sections that correspond to a height level associated with a singular nanowire, i.e. a top isolated gate electrode can correspond to the top-most nanowire; a middle isolated gate electrode can correspond to the middle nanowire, etc.

Techniques herein include a common gate structure having NMOS and PMOS gate electrodes positioned in a vertical orientation, allowing for NFET and PFET wires to pass through corresponding gates in a logic design in a complementary manner (i.e. where NFET and PFET are shared by the same lateral wire array formed from a single Si/SiGe fin). Embodiments include gate electrodes that are "stair-cased" or step-shaped as well as overlapping thereby providing a physical gate electrode region and an extension that extends up to the top of the cell to provide electrical access to the gate.

Figure 1:
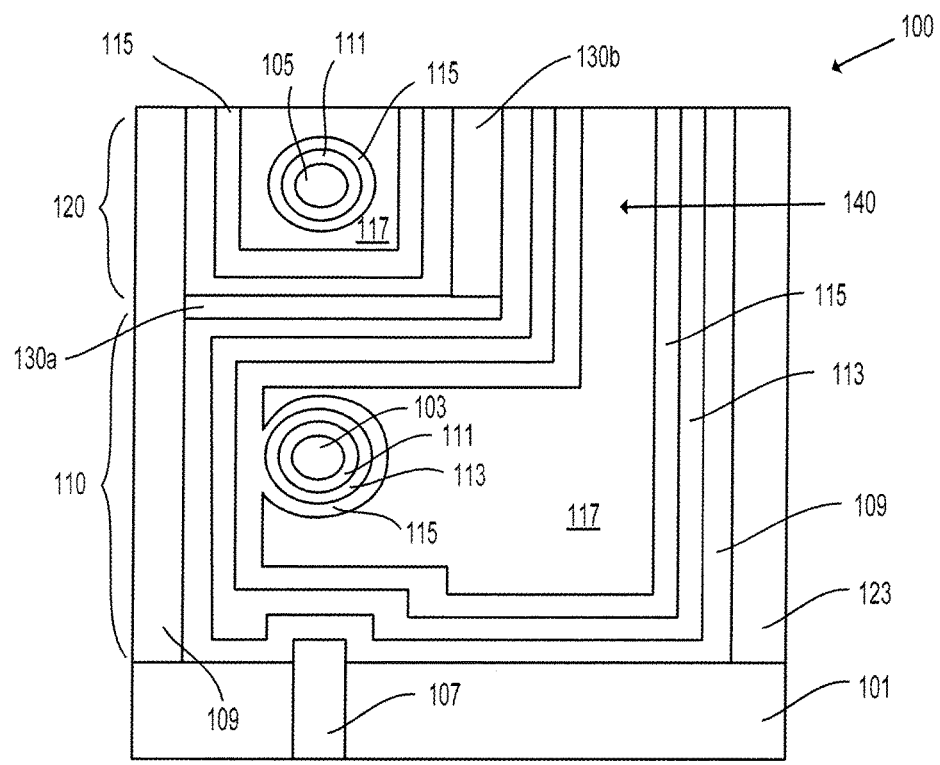
FIG. 1 is a schematic illustration of a cross-section of a slacked complementary FET device according to embodiments of the disclosure.

FIG. 1 is a cross-section of a gate region structure of vertically stacked devices in accordance with aspects of the invention. As seen, the structure 100 includes a substrate 101 having PMOS electrode section 110 and NMOS electrode section 120 provided in vertical relation to each other on the substrate 101. The substrate 101 includes a bulk fin 107 of material remaining from an initial multilayer fin structure from which the nanowires 103 and 105 are released. Thus, in the example embodiment of FIG. 1, the stacked devices within the gate region are single nanowire devices which can provide a current channel region for respective FET devices, for example. However the electrode structure and techniques described herein can apply to any stacked devices such as multichannel FET devices.

The gate region is bordered by stack isolation structures 109 which can isolate the stacked device structure from an adjacent structure, such as another stacked device structure. The gate region includes a PMOS gate electrode section 110 (lower electrode) and an NMOS gate electrode section 120 (upper electrode). The lower electrode section is physically and electrically isolated from the upper-electrode section by a gate isolation structure 130. In the example of FIG. 1, the gate isolation structure 130 includes a horizontal isolation portion 130a and a vertical isolation portion 130b. Horizontal portion 130a isolates the lower electrode from the upper electrode, and vertical portion 130b isolates the upper electrode from an extension portion 140 of the lower electrode. The extension portion 140 permits access to the lower electrode from a surface of the electrode region.

As seen, the stack isolation structures 109 and the gate isolation structures 130 together define two gate chambers each containing a respective gate electrode section. After release of the nanowires from a fin structure, the wires are suspended nanostructures supported on opposing ends by gate structures, such as gate spacers (not shown in the cross section) which isolate the gate region from source-drain (S/D) regions. The suspended wires are processed to include a gate dielectric and gate metals around the nanowire. Thus, as seen in FIG. 1, PMOS electrode section 110 includes a Si nanowire 103 surrounded by a layer of high-K material 111, a layer of PMOS metals 113 and a layer of work function metal 115 successively formed on the PMOS nanowire 103.

Similarly, the NMOS electrode section 120 includes Si nanowire 105 with high K material 111 and work function metal 115 thereon. Metal fill 117 is provided within the PMOS and NMOS gate sections respectively. As seen in FIG. 1, the lower electrode section 110 and gate extension 140 form a "step" shape, and the NMOS electrode section 120 is a plug shape resting on a horizontal portion of the step of the lower electrode.

Techniques herein can be used for multiple types of FET devices. Techniques here find particular benefit to programmable logic and SRAM. For convenience in describing structures and processes herein, the remaining description will primarily focus on explaining techniques in the context of an SRAM cell.

As noted above, one challenge with stacking NFET and PFET wires on top of one another in a 3D SRAM configuration involves how to connect each portion of the gate to its corresponding word-line or other type of local interconnection such as a cross-couple used for SRAM. This challenge is overcome herein for example by a step-shaped electrode configuration in which a vertical metal extension (such as PMOS gate extension 140) for a bottom gate electrode is connected to the middle of line (MOL) metal module through the step-shaped extension which serves as an in-situ contact to the bottom gate electrode.

The step-shaped overlapping design of the individual gate electrodes can be constructed for more than two stacked wires where individual contact can be made by either alternating a position of the in-situ extension on either left or right-hand side relative to the top gate electrode, or through an actual stair-cased pattern where the contact extensions for each increasing level of gate electrode, within a common direction, this making the contact extensions appear as a series of "stair steps".

Figure 2:
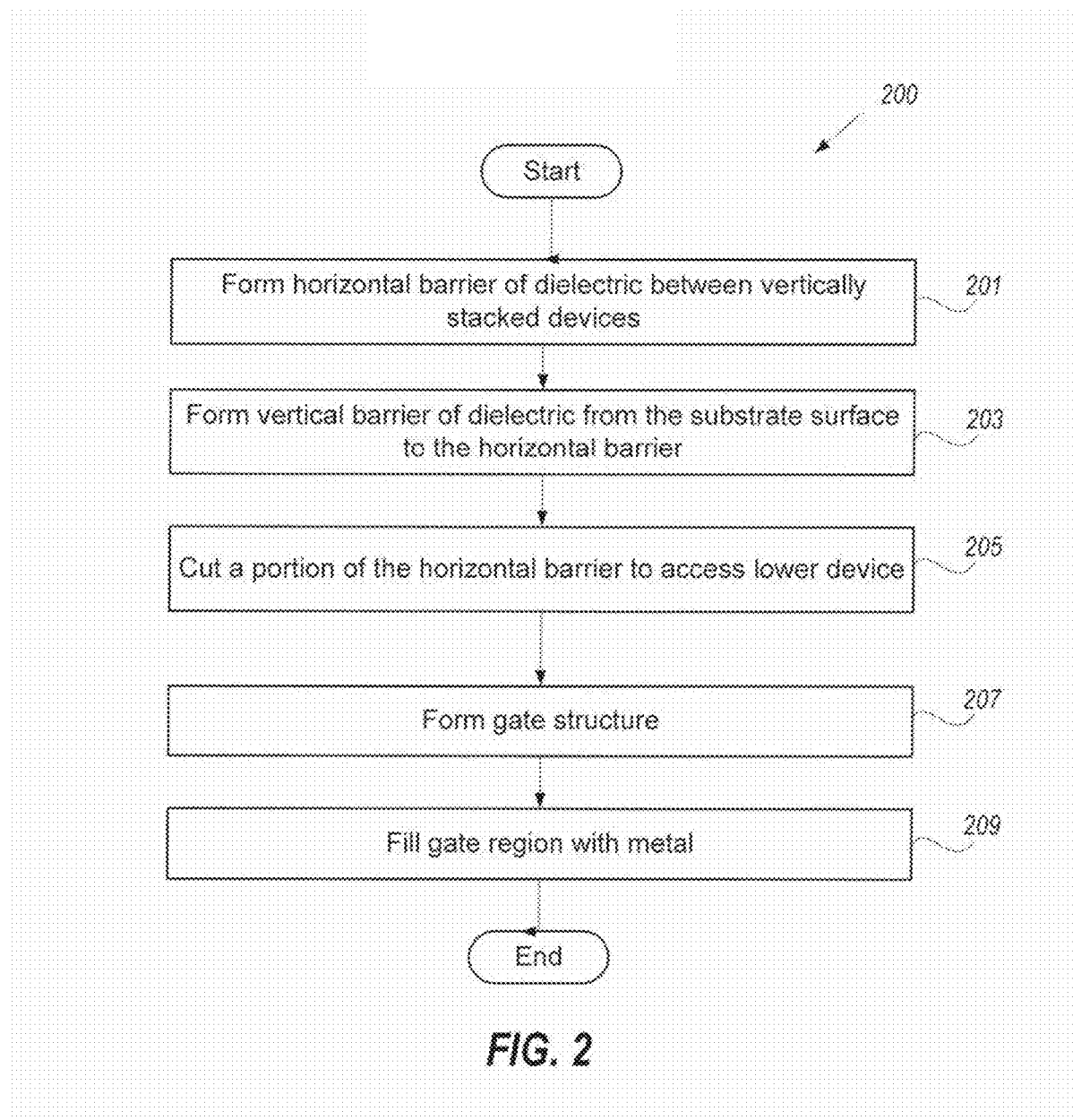
FIG. 2 is a flow chart of a manufacturing process for making an electrode structure according to embodiments of the disclosure.

Metalizing the combined gate of a device such as that in FIG. 1 can be done through a variety of methods. FIG. 2 is a flow chart of a process for forming a gate structure in accordance with aspects of the invention. In step 201, a horizontal barrier of dielectric is formed between vertically stacked devices. In one embodiment, a common gate is opened meaning that polysilicon of a replacement gate has been removed from the area inside the common gate. After nanowires are formed (either through removal of SiGe within a fin to release silicon wires, or vice-versa where silicon is released to form SiGe wires), some material such as SiO is filled within the gate and recessed down to the level at which the gate electrode separation is desired. This recess can be done through an isotropic etch process such as by using a CETRAS etch tool manufactured by Tokyo Electron Ltd. Such vapor phase etching has the benefit of being a cyclical process, allowing the etch rate and recessed depth to be precisely controlled. A selective deposition process can be executed in which another dielectric material can be deposited over the top of the recessed fill material with no deposition done elsewhere in the gate (especially not along the silicon or SiGe nanowire). The selectively deposited material forms a horizontal dielectric barrier (that will become barrier 130a, for example) between the stacked devices (such as nanowire devices 103 and 105 of FIG. 1.

Once a horizontal barrier is formed, a vertical barrier of dielectric can be formed down to the horizontal barrier (i.e. beside fewer than all devices in the vertical stack) in step 203. Continuing with the example above, after selective deposition of the horizontal barrier, a the gate region can be filled with the same filling material over the horizontal barrier, and trench can be formed and used to etch down to the top of the horizontal dielectric. This trench can be filled with a dielectric of choice such as SiN to provide the vertical dielectric barrier (such as barrier 130b).

In step 205, a portion of the horizontal barrier is removed to gain access to lower devices in the vertical stack. In one embodiment, a "cut region" can be patterned and then transferred to the top of the selectively deposited material forming the horizontal separation between gate electrodes. The horizontal dielectric isolation between gate electrodes can then be punched open. A size of the "cut region" can essentially define a size and shape of the in-situ contact extension (such as 140) that will extend down to the lower gate electrode. SiO fill can then be removed across all gates to permit forming of the gate structures in step 207.

In forming the gate dielectric, high-k material such as HfO can be deposited across both gate electrodes through ALD film formation. Where gate metals of the stacked devices differ (such as with the example of FIG. 1), the gate region can be filled again, and the PMOS region of the gate can be opened and the SiO fill removed only from the PMOS section. PMOS gate electrode metal depositions can then be executed that will wrap the PFET wires with gate metal materials which on the NFET side the deposited metals will just deposit overtop the filled SiO fill material.

The PMOS gate electrode can be filled with SiO and then a planarization step or recess by CMP can be used in order to clear the gate metals that have been deposited on the surface of the NMOS SiO fill material so that, only PMOS metals exist within the PMOS gate electrode. The SiO can be re-opened in the entire gate region, and WFM deposited into the gate through ALD deposition, followed by CVD or PVD deposition of the final gate metal fill.

Accordingly, the PMOS metallization can be done through blocking the NMOS gate electrode and depositing only within the PMOS gate electrode, and subsequently removing the fill material in the NMOS gate electrode prior to WFM deposition. An alternative method is depositing PMOS metal into both NMOS and PMOS gate electrodes and then filling in the PMOS gate electrode and etching the PMOS gate metals from the NMOS gate electrode before removing the fill material.

In some embodiments if is beneficial to not etch any gate metal materials once the gate channel is formed to reduce potential for detectivity or to increase reliability so the former PMOS metallization process is preferred. For embodiments where there is inadequate room to do this method, a "tone-reversal" process can be used where the NMOS gate electrode if filled and "sheltered" by the grown dielectric film overtop. Any deposition of PMOS metals would be done along the vertical face of the block, and subsequent atomic layer etching (ALE) can be done to selectively remove the deposited PMOS gate metals from the vertical face of the blocking material. This option provides a means from which the materials can be removed without causing a concern for etch damage by directly removing the material from the gate electrode after the channel has been formed.

One option of embodiments herein is to enable un-metalized wires within either NMOS or PMOS gate electrode, and the functionality of this process is to incorporate an in-situ cross-couple within a gate structures. Cross-couples, as used for the case of SRAM designs, function by taking the charge in a S/D bar and transferring it to the input to a control gate. This is typically done through a local interconnect layer, which leads to congestion for the case of a 3D SRAM device. Techniques herein, however, remove the need for the cross-couple to be routed through a local interconnect metal layer. Instead, the cross-couple can be routed directly through a multi-chambered gate, where the wires coming from the S/D bar need to have no high-K deposition done on them. Hence the multi-chambered gate embodiment incorporates a control gate and pass gate both located within the same structure (gate, gate region, cell).

Figure 3:
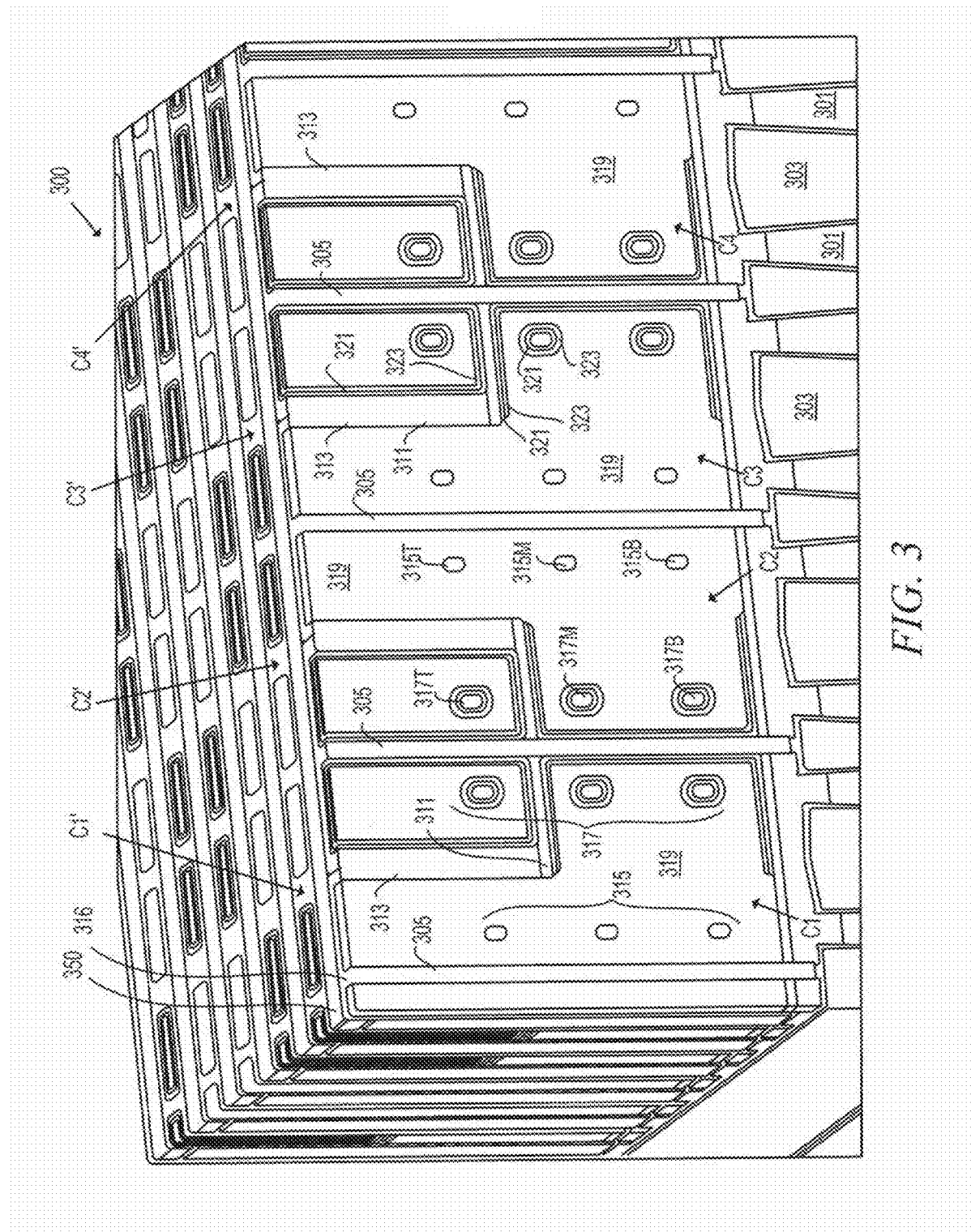
FIG. 3 is a cross-sectional perspective view of an example stacked complementary FET device according to embodiments of the disclosure.

FIG. 3 is a perspective cross-section of a semiconductor structure employing a gate electrode with unmetallized wires according to an example embodiment of the disclosure. The structure 300 includes many SRAM cells provided on a substrate which can include bulk fins 301 and shallow trench isolation (STI) regions 303. In FIG. 3, four SRAM cell portions C1, C2, C3 and C4 are shown by a cross section through gate regions of these cell portions. Cell portions are also formed longitudinally along the structure 300 (e.g. C1', C2', C3' and C4') A source-drain (S/D) bar 350 immediately behind the cross sectioned gate region (and other gate regions) provides doped S/D contacts and S/D electrode structures for the respective gate regions. Techniques for forming S/D electrodes and doped extension regions are disclosed, for example, in U.S. provisional application No. 62/363,973 filed on Jul. 19, 2018 and U.S. provisional application number and to U.S. provisional application No. 62/373,164 filed on Aug. 10, 2018. The entire contents of each of these applications are incorporated herein by reference.

As seen in FIG. 3, isolation structures 305 isolate cell portions and define a gate region of the cell portion. Each gate region includes two nanowire stacks 315 and 317 provided side-by-side within the gate region. Each nanowire stack 315, 317 includes three nanowires provided in vertical relation to one another, where "B" notes the bottom wire, "M" notes the middle wire and "T" notes the top nanowire. In FIG. 3, nanowire stack 315 includes PMOS nanowire 315B and NMOS nanowires 315 M and 315T, and nanowire stack 317 similarly includes PMOS nanowire 317B and NMOS nanowires 317M and 317T. Thus, each gate region includes a total of six nanowires. Nanowires 315B, 315M and 315T do not include gate layers thereon, while each of the nanowires of stack 317 includes a high K layer 321 and metal layer 323 formed thereon. Gate metal fill 319 surrounds all of the nanowires.

A gate isolation structure physically and electrically separates each gate region into separate gate electrodes encompassing one or more of the nanowires within the gate region. As seen in cell portion C1, isolation structure 311 extends horizontally across a portion of the gate region and isolation structure 313 extends vertically along a portion of the gate region. Together, the horizontal and vertical isolation structures 311 and 313 isolate nanowire 317T of the gate region from the other nanowires in the gate region. High K layers 321 and metal layers 323 are also provided on the isolation structures 305, 311 and 313 due to the manufacturing process described below.

As seen in FIG. 3, adjacent gate regions along the cross section have a mirror image configuration, and this mirror image topology is repeated laterally along the structure 300. Thus, as seen, cell portions C1 and C3 have a same configuration, and cell portions C2 and C4 have a same configuration. The cell portions extending in a longitudinal direction also provide a mirror image configuration. That is, cell portions C1', C2', C3' and C4' have a configuration which is a mirror image of C1, C2, C3 and 04 respectively, in the embodiment of FIG. 3, each pair of cell portions C1-C1', C2-C2' etc. make up a full SRAM device. Thus, each SRAM cell includes a total of twelve nanowires, with six nanowires providing FET devices for the SRAM, while the remaining six nanowires provide cross coupling of the inverters of the SRAM as noted above.

In the example of FIG. 3, each gate electrode region is divided into two gate electrodes; a first gate electrode including all of the nanowires of stack 315 as well as the nanowires 317B and 317M of stack 317 and which performs a CONTROL gate function for the six transistor SRAM, and the second electrode including nanowire 317T which performs a PASS gate function of the SRAM, in this embodiment, one benefit is that only a word-line contact is created at the upper isolated gate and no contact is needed for a local interconnect to create the cross-couple for the control gate because the cross-coupling is done by means of the un-metalized wires being within the same gate as the metalized wires connecting to Vdd and Vss.

Thus, embodiments herein include semiconductor devices. Such devices can include a substrate and a gate region of a field effect transistor formed on the substrate. The gate region includes vertically stacked nanowires having longitudinal axes that extends parallel with a working surface of the substrate. A given stack of vertically stacked nanowires includes at least two nanowires vertically aligned in which a p-type nanowire and an n-type nanowire are spatially separated from each other vertically. A step-shaped wiring structure is formed within the gate region that electrically connects each nanowire to positions above the gate region. At least a first electrode has a step-shaped profile and connects to a first-level nanowire.

Techniques herein have multiple embodiments and can be used for FET devices for both memory and logic applications. Embodiments enable having a gate with an isolated PMOS and NMOS gate electrode portion, and also enable a gate having isolated CONTROL and PASS gate components. One example method for fabricating such a semiconductor device will now be described. This example method includes making a single gate composed of a PASS and CONTROL gate in a 3D SRAM architecture, where the gates are isolated from each other by means of patterning integration.

Figure 4B:
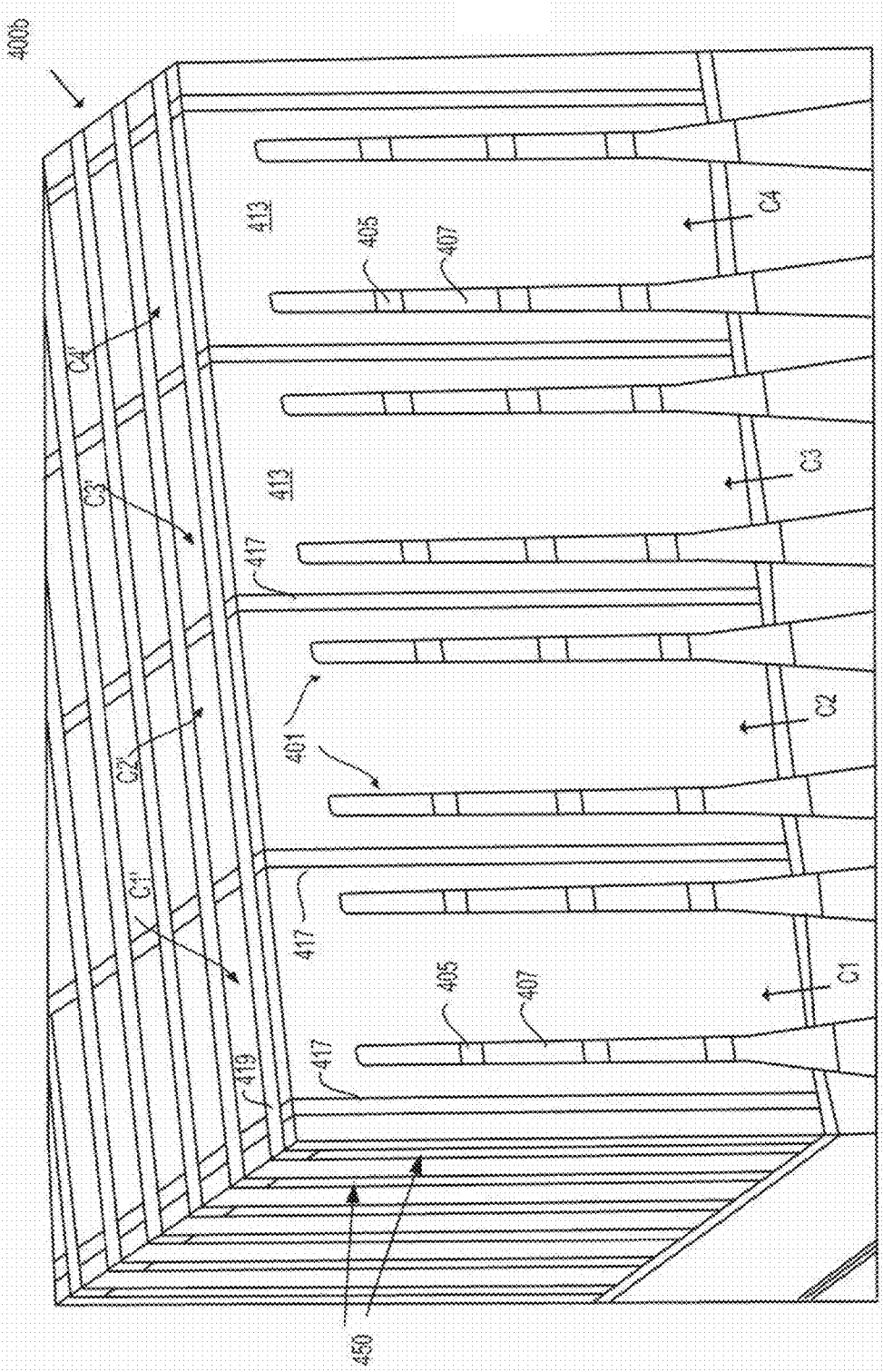
FIG. 4B is an example intermediate structure for forming a 3D SRAM according to embodiments of the disclosure.

FIGS. 4A-4J are perspective cross-sections of various structures during the process of forming the device of FIG. 3. Nanowires can be created with a vertical stack. One starting point is creating Si/SiGe fins that will become the silicon nanowires FIG. 4A shows a starting structure for forming the SRAM structure of FIG. 3. As seen, the structure 400A includes a substrate having fins 401 thereon. Each fin 401 includes alternating layers of Si material 405 and SiGe 407. In the embodiment of FIG. 4A, the fins 401 start with Si as bulk fin material, and thus bulk fin portion 408 is separated by STI isolation 403 at the bottom of the fin structure. The multilayer fins of alternating Si/SiGe material are formed within a polysilicon replacement gate 413 and bounded by a gate spacer behind the polysilicon 413. The gate spacers are not shown in the cross section of FIG. 4A, but gate spacer material 415 may be provided above the structure 400a as shown.

As noted above, the example embodiment includes a 3D SRAM array in which 4 SRAM cells are adjacent to one-another. The cross-section above is along the north-south axis in order to show what happens within a physical gate structure. Each 3D SRAM cell in this example has an upper NFET wire connected to the BL or BLB (bit-hue or bit-line-bar) in the S/D bar region, a middle NFET wire connects to Vss in the S/D bar, and a lower PFET wire connects to Vdd in the S/D bar. Each SRAM will be composed of two sets of nanowires, where one wire is to connect to BL while the other to BLB in the array.

Physical isolation (barriers) between the SRAM cells can be defined. FIG. 4B is a perspective cross-section of a structure having cell isolations. As seen, the structure 400b includes cell isolation structure 417 which divides the structure 400b into four cell portions C1, C2, C3, and C4 separated from each other by cell isolation structures 417. Note that each SRAM cell can contain two sets of lateral nanowires, which can be multi-layer fins prior to processing into nanowires. The isolation width can be set to provide adequate capacitance between adjacent gates within the dense 3D SRAM array. A patterned etch mask can be formed on the substrate to define trenches for dividing cells and forming cell barriers.

This cell isolation trench can be transferred into the replacement gate 413 and filled with a dielectric, such as would be used in a gate spacer 415 (not shown in FIG. 4B) separating the gate from the adjacent S/D bar structure. As shown in FIG. 4B, vertical cell barriers 417 have been formed (isolation trench filled). Any deposition of isolation trench material on the top of the SRAM cell can be recess-etched back to the surface of the cell or even planarized via chemical-mechanical polishing (CMP) to reveal or uncover the polysilicon 413 in the replacement gate as shown in FIG. 46.

The S/D bar region 450 at this point can be filled with a dielectric such as SiO, and it is beneficial to have this SiO recessed and then capped with a material 419 that will have selectivity (etch resistivity) to the other materials that will be used in the formation of the multi-tiered gate so that the S/D bar region 450 is protected while forming electrodes in the gate region. This protection can be executed through a selective recess of the SiO in the S/D bar 450 followed by deposition of the capping material 419 and then either recess down or CMP to stop on the dielectric fill material within the gate isolation trench, or on the polysilicon in the replacement gate 413 as shown in FIG. 4B.

After cell isolation structures 417 are formed, the polysilicon replacement gate material 413 can be removed, either through dry plasma etch, vapor-phase etch removal, or wet removal. This will expose the Si/SiGe fin 401 along with the protective liner (not shown) that exists over the fin to protect the fin material from being etched during the polysilicon replacement gate removal. The protective liner over the fin can be removed by plasma etch or atomic layer etching (ALE) once the polysilicon is removed from the replacement gate. This results in the Si/SiGe fins 401 extending between gate spacers 415 and exposed for further processing.

Figure 4C:
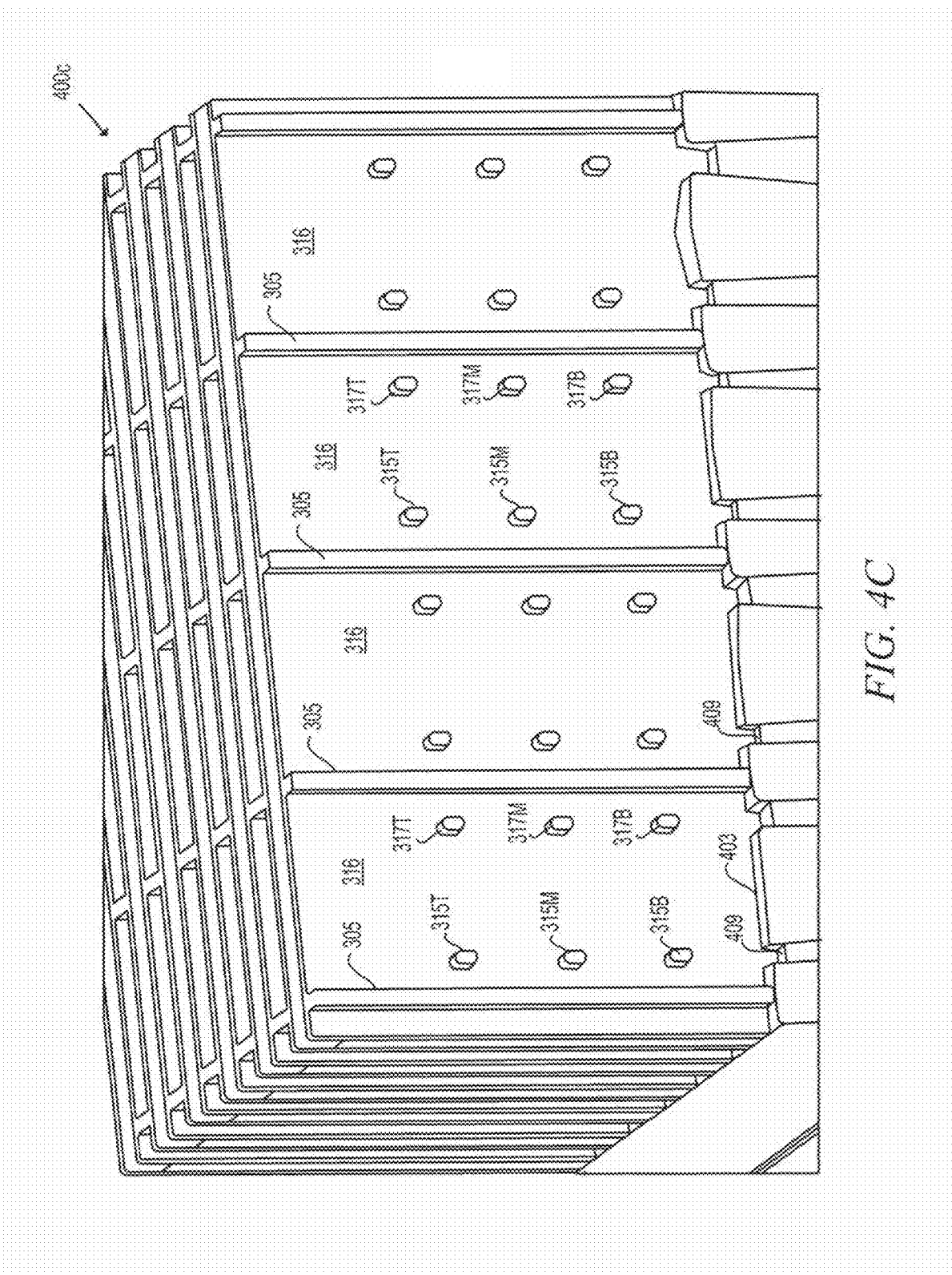
FIG. 4C is an example intermediate structure for forming a 3D SRAM according to embodiments of the disclosure.

For the silicon nanowire process, as described here, the SiGe material 407 of the tins 401 is selectively removed from the silicon 405 in order to release the silicon wires. Alternatively, the opposite can be executed to preserve SiGe wires while removing silicon. This release process can be done through vapor-phase etch which can have over 100:1 selectivity between silicon and 20% SiGe and vice-versa. Once the silicon wires have been released, the nanowires can be shaped through Tokyo Electron SPA plasma treatment to round the wires, providing means to produce optimal drive current through the device. FIG. 4C shows Si nanowires 315T, 315M and 315B and 317T, 317M and 317B released from fins 401. In FIG. 40, the polysilicon is removed to reveal the gate spacer material 415. As seen, the nanowires 315 and cell isolation trenches 305 are protruding from the revealed gate spacer 316 in the cross-sectioned gate region. A shelf formed by the bulk fin 409 and STI 403 is also shown as protruding structures because the gate regions are open.

The gate region can then be filled with a temporary fill material, such as SiO to prepare for the gate metallization process. FIG. 4D shows a gate region cross section having the temporary fill material 430. The fill material 430 preferably can fill in between the protruding silicon nanowires 315, 317 and also have good selectivity to the silicon wires and the gate spacer material 415 (not shown), and optionally have good planarization capability with CMP-stop on the gate spacer or isolation trench 305. The temporary fill material 430 is then isotropically recessed to a desired point. For the 3D SRAM design example discussed, isolation between CONTROL and PASS gate is needed within the common gate region. The recess can be done through Tokyo Electron CERTAS process which possesses over 100:1 selectivity between SiO (if SiO is used as the temporary gate fill-material) and the silicon wire and gate spacer material. Because such vapor-phase etching is cyclic in nature, the etching can stop at precise distances between lateral nanowires.

Figure 4E:
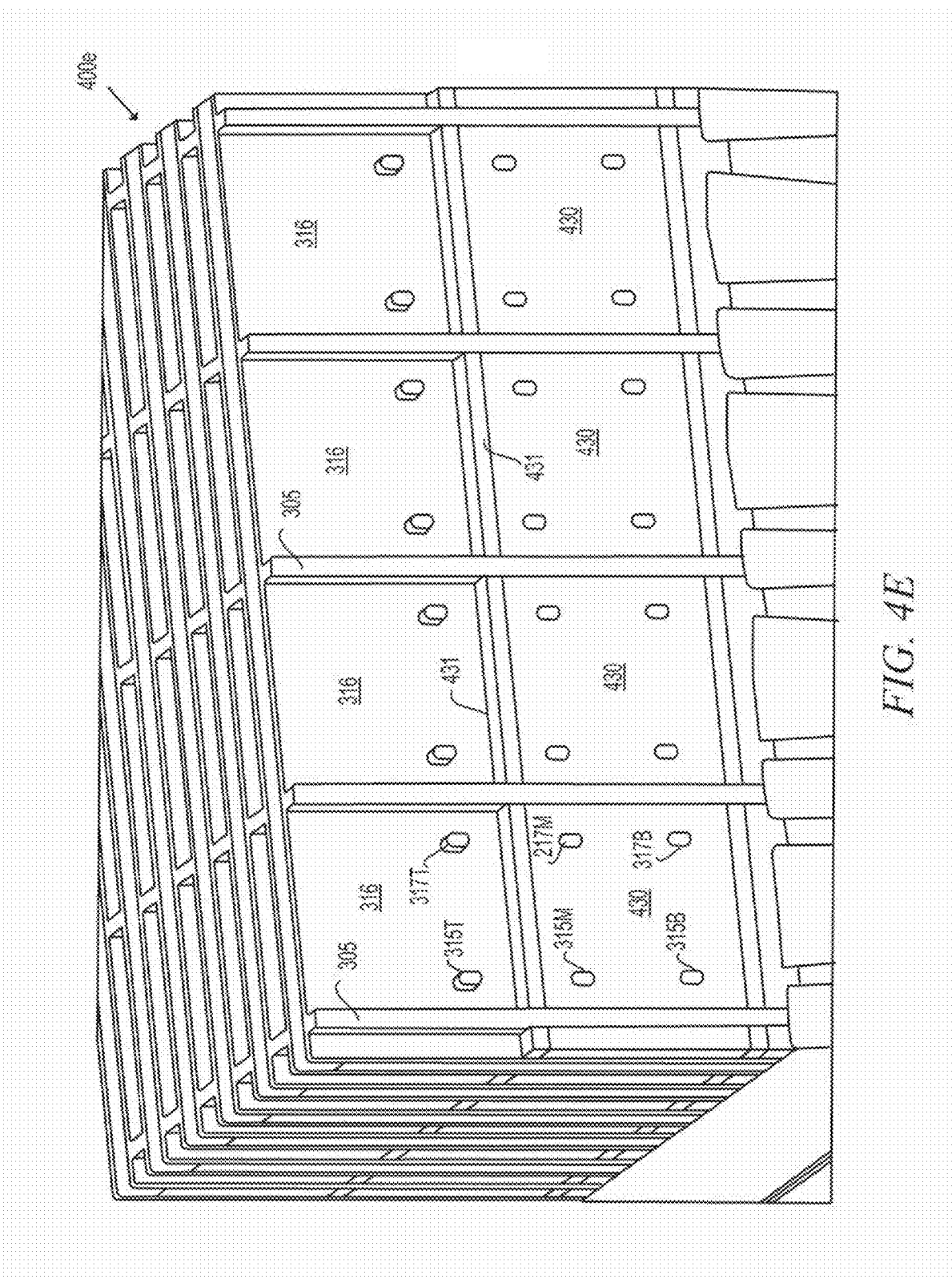
FIG. 4E is an example intermediate structure for forming a 3D SRAM according to embodiments of the disclosure.

Another dielectric film can be selectively deposited overtop the primary temporary gate fill material to form a horizontal barrier 431 which can be a bottom isolation between the PASS and CONTROL gates. Alternatively, the primary temporary fill material can be a metal such that selective deposition includes growing a dielectric selectively on the surface (such as AlO growth over Co/Al). FIG. 4E shows that the temporary fill 430 has been recessed until uncovering/revealing a top nanowire layer across the cells, with an upper surface of the temporary fill positioned approximately halfway between the top nanowire layer (315T, 317T) and the middle nanowire layer (315T, 317T). Thus, nanowires 315T and 317T are protruding from the gate spacer 415, while nanowires 315M, 315B, 317M and 317B are embedded within the fill 430.

Figure 4F:
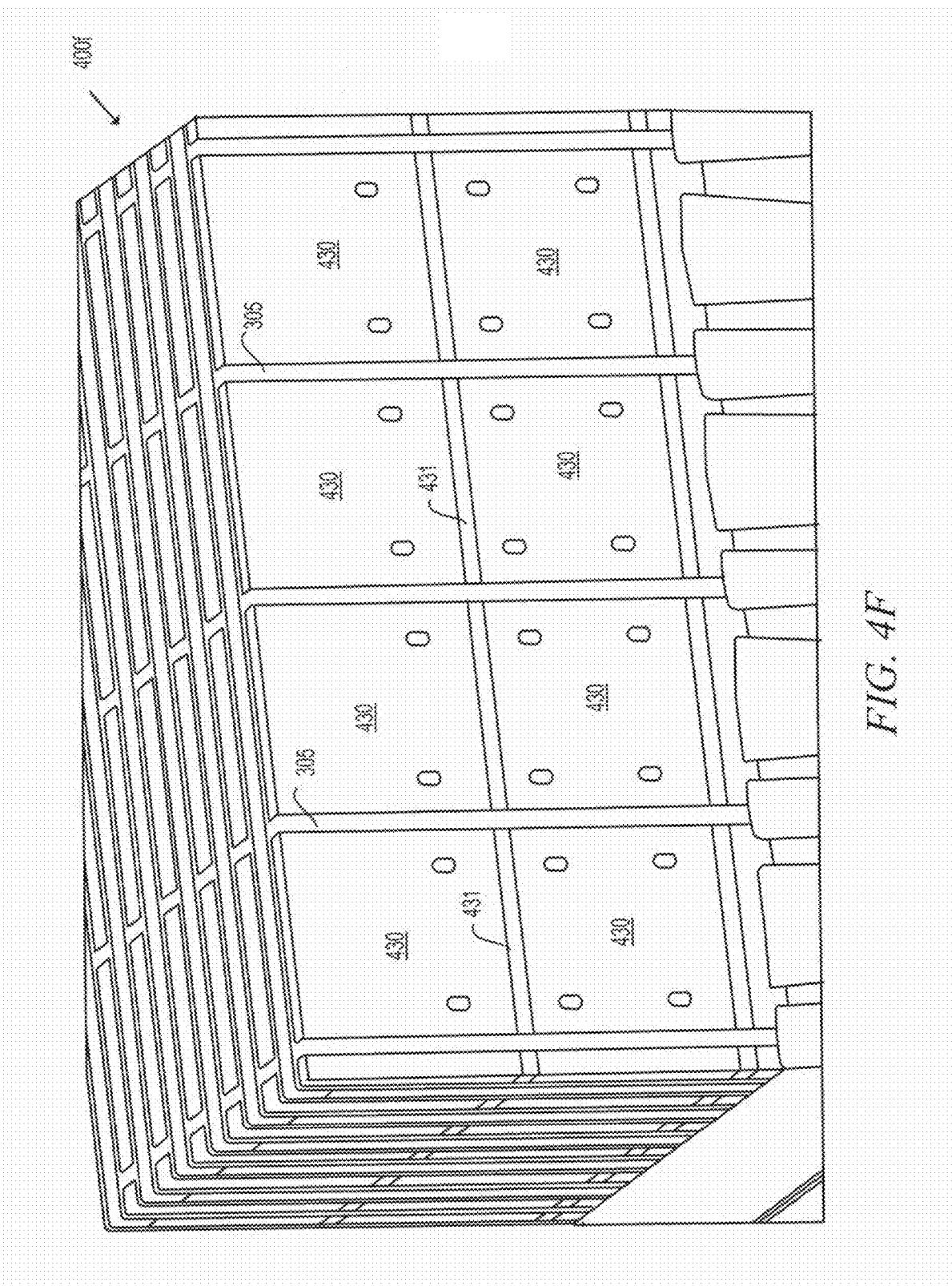
FIG. 4F is an example intermediate structure for forming a 3D SRAM according to embodiments of the disclosure.

The opened portion of the gate region (portion above the horizontal barrier 431) can then be filled with the same temporary fill material (such as SiO) that was used previously to fill the entire gate. FIG. 4F shows temporary fill material added above the horizontal barrier.

Figure 4G:
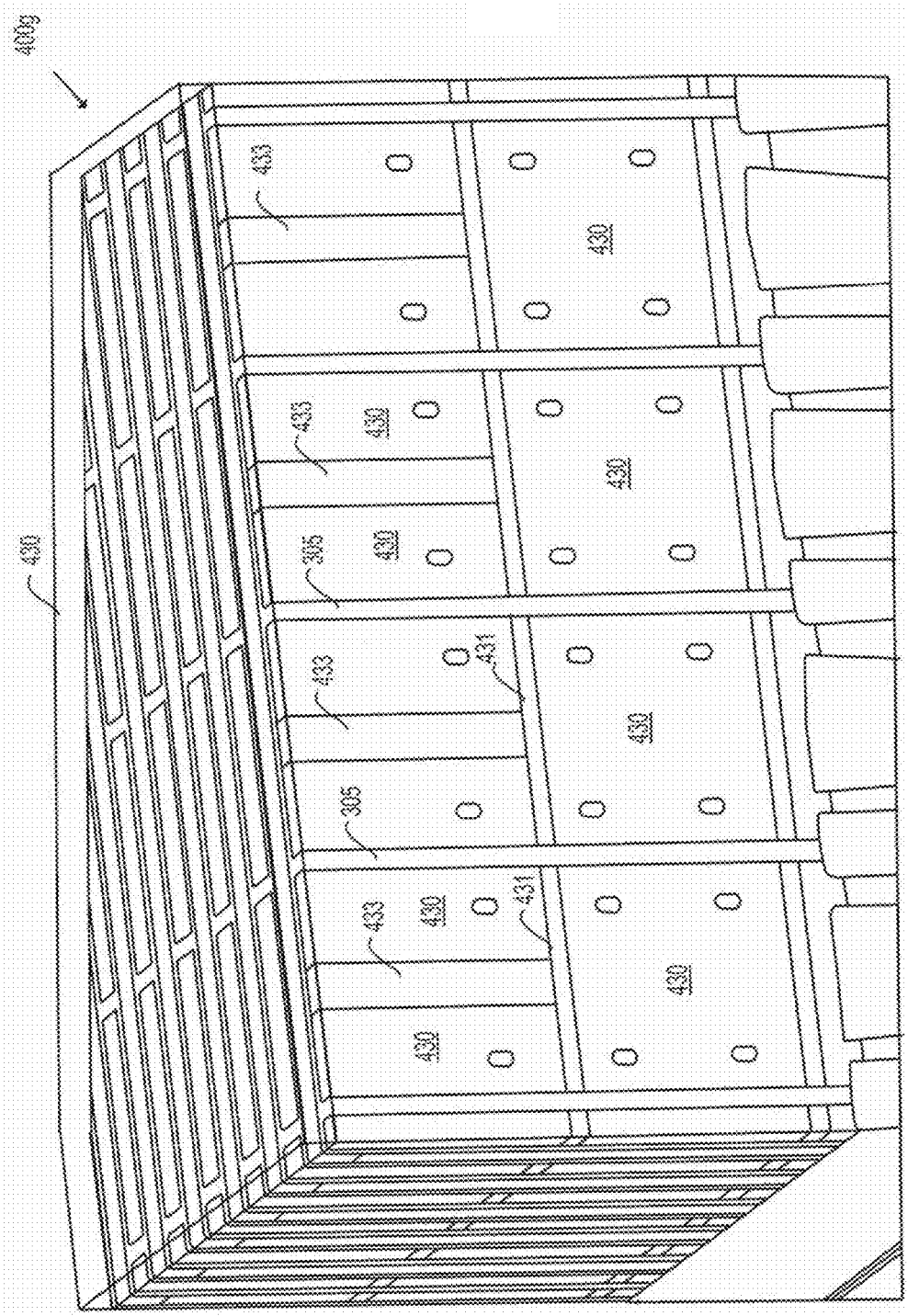
FIG. 4G is an example intermediate structure for forming a 3D SRAM according to embodiments of the disclosure.

Another patterned etch mask can be formed on the substrate defining trenches to create a space for vertical electrode barriers. This pattern will provide vertical side isolation between the PASS and CONTROL gates within a common gate structure. This second trench pattern of this mask is transferred through the temporary fill material 430 in the gate with end-point on the dielectric 431 that was formed to provide the vertical isolation between PASS and CONTROL gates, that is, the horizontal barrier 431. Fill material 430 can then be provided in the upper part of the gate region and may be formed over the entire structure 400f to provide masking for further processing. FIG. 4G shows the vertical electrode barrier 433 having been formed, the etch mask removed and the upper portion of the gate region filled with fill 430 (fill 430 to be used as a mask is shown transparent over the structure 400g). A width of the vertical electrode barrier 433 can be set to provide both the isolation properties between the CONTROL and PASS gate, and also to provide sufficient edge-placement-error (ERE) tolerance for the next steps in which either side of the gate isolation trench 433 needs to be opened up in order to do metal processing for either the CONTROL or PASS gate.

Another patterned etch mask can be formed over the fill mask material 430 to block the PASS gate region and open the CONTROL gate region. This blocking and subsequent processing can be used to join the nanowires of stack 315 that will be used in the internal cross-couple to the nanowires contacting to Vss and Vdd of the SRAM. With a patterned etch mask on the substrate uncovering CONTROL gate openings, the temporary fill material in the CONTROL gate region is etched.

Figure 4H:
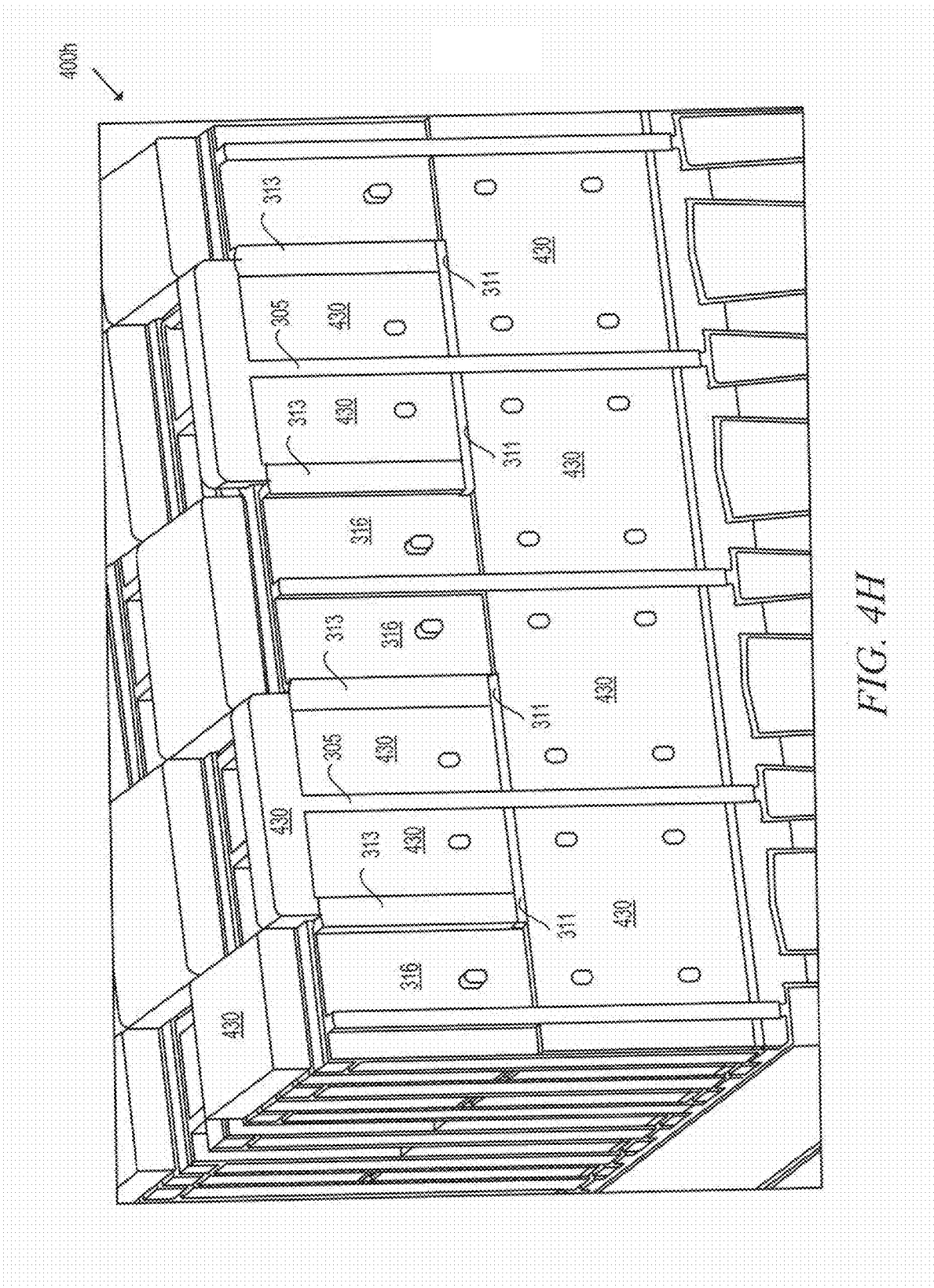
FIG. 4H is an example intermediate structure for forming a 3D SRAM according to embodiments of the disclosure.
Figure 41:
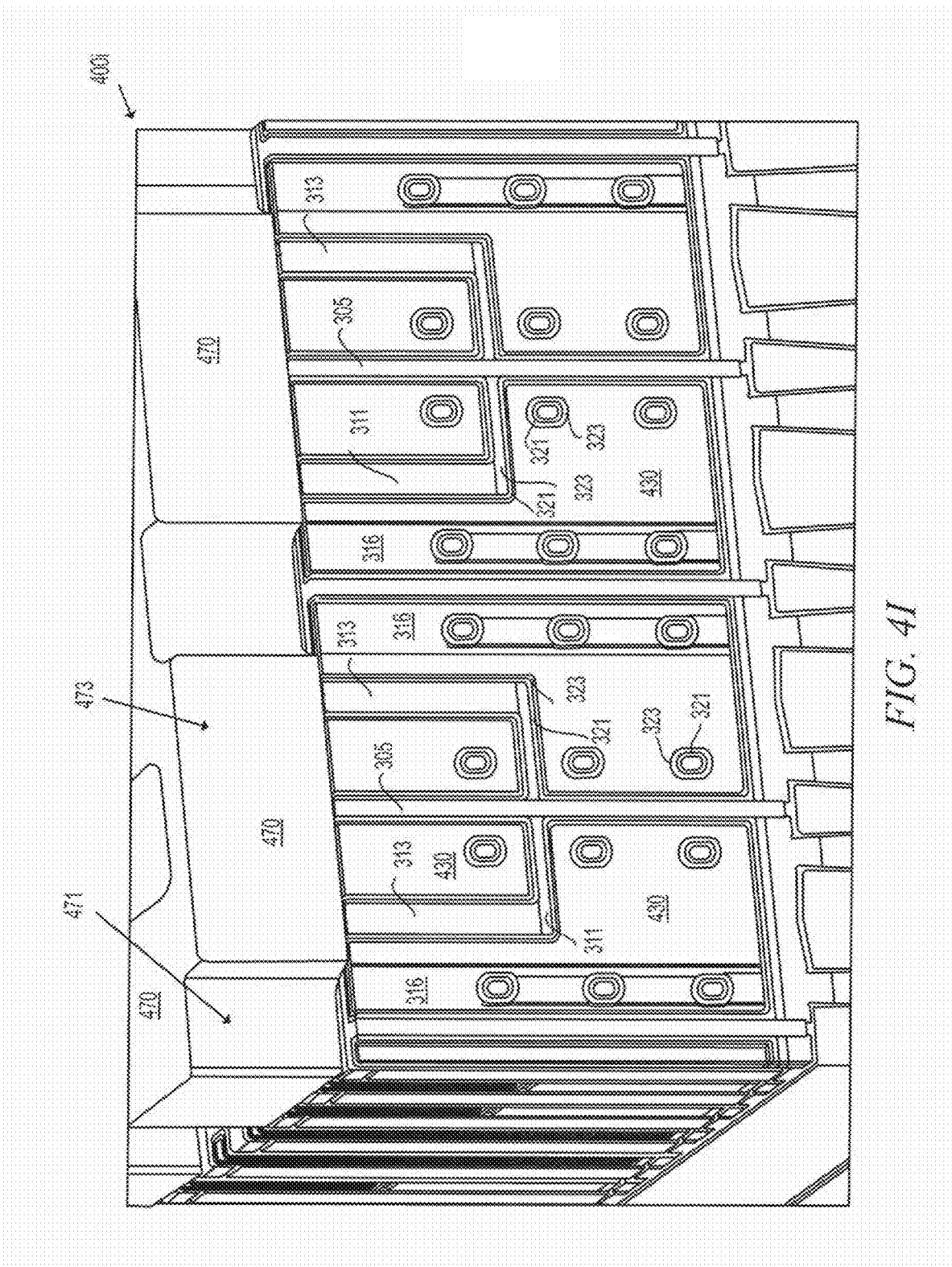

The temporary fill material is selected to have etch selectivity between the vertical electrode barrier 433 and the horizontal barrier 431. By way of a non-limiting example, the vertical electrode barrier 433 can be silicon nitride, the horizontal barrier 431 can be aluminum oxide, and the temporary fill 430 can be silicon oxide isolation between SRAM cells can also be silicon nitride. Removing the temporary fill 430 opens up the isolation that exists between the upper and lower gate electrodes (opens the horizontal barrier 431) to enable the CONTROL gate to encompass all of the nanowires 315 and to produce an in-situ contact extension in the gate metal. FIG. 4H shows the temporary fill having been removed in the CONTROL gate, as well as the horizontal barrier 431 being opened within the CONTROL gate portion to form the horizontal isolation 311. The patterned mask of material 430 is also shown.

Once the horizontal barrier 431 (dielectric barrier) between the upper and lower gate electrodes is opened, temporary fill material 430 in all of the gate region can be removed. At this point in the processing, each cell region is effectively isolated from each other, and each cell includes two electrode channels or spaces that are physically and electrically separated from each other. In the example embodiment discussed, the CONTROL and PASS gates are effectively isolated from one another by isolation structures 311 and 313 and now the individual gate metallization can be executed. For more simple gate structures where is there only NMOS and PMOS separation, there are several options to metalize. One option includes blocking the NMOS gate electrode and depositing only within the PMOS gate electrode, and subsequently removing the fill material in the NMOS gate electrode prior to WFM deposition. Alternatively, PMOS metal is deposited into both NMOS and PMOS gate electrodes and then filling in the PMOS gate electrode and etching the PMOS gate metals from the NMOS gate electrode before removing the fill material.

For the non-limiting example embodiment herein, the NFET and PFET wires (317B and 317M) that will connect to Vss and Vdd, respectively will share a common NMOS gate, however the un-metalized wires 315T, 315M and 315B completing the internal cross-couple should not have any high-K material deposited overtop or around these specific wires. Moreover, the isolated PASS gate 317T that will contact the word-line will be metalized as a NMOS gate.

Although it may not always be desirable to etch gate metals once deposited, etching after deposition of the gate metal is acceptable herein since the cross-couple will be executed in an opened area of the gate (meaning that the wires to be metallized in the CONTROL gate are under the dielectric barrier. This example process can fee executed by etching away unwanted metal from the wires associated with the cross-couple. Alternatively, this process can be executed via a tone-reversal protection process to protect the wires under the dielectric barrier from any damage with the metal removal from the cross-couple wires.

With all of a gate region open (both CONTROL and PASS regions open), an ALD deposition of high-k material such as HfO can be executed into the entire gate followed by deposition of the gate metals such that a high-k layer 321 and gate metal layer 323 are formed on each of the six nanowires in the gate region. With the gate layers deposited, the gate region can then be filled again with a temporary fill material 430 such as SiO which can be easily and selectively removed by Tokyo Electron CERTAS process in later steps without damaging the gate channel.

Once the fill is completed and recessed or polished back to the fop of the gate structure, another open pattern can be done that will open a channel within the CONTROL gate region and keep the PASS gate portion blocked. FIG. 4I shows a structure 400i including a mask 470 having a control gate region opening portion 471 and a pass gate region blocking portion 473. As noted above, landing portions of a block mask 470 open occur on the thicker dielectric isolation (vertical electrode barrier) 313 which can be sized to provide adequate edge placement tolerances to the design. The mirror-image nature of the SRAM structure allows for the blocking and/or opening to be done across two adjacent cells, which allows for the open mask to always land on the thicker isolation trench filled with dielectric.

Figure 4J:
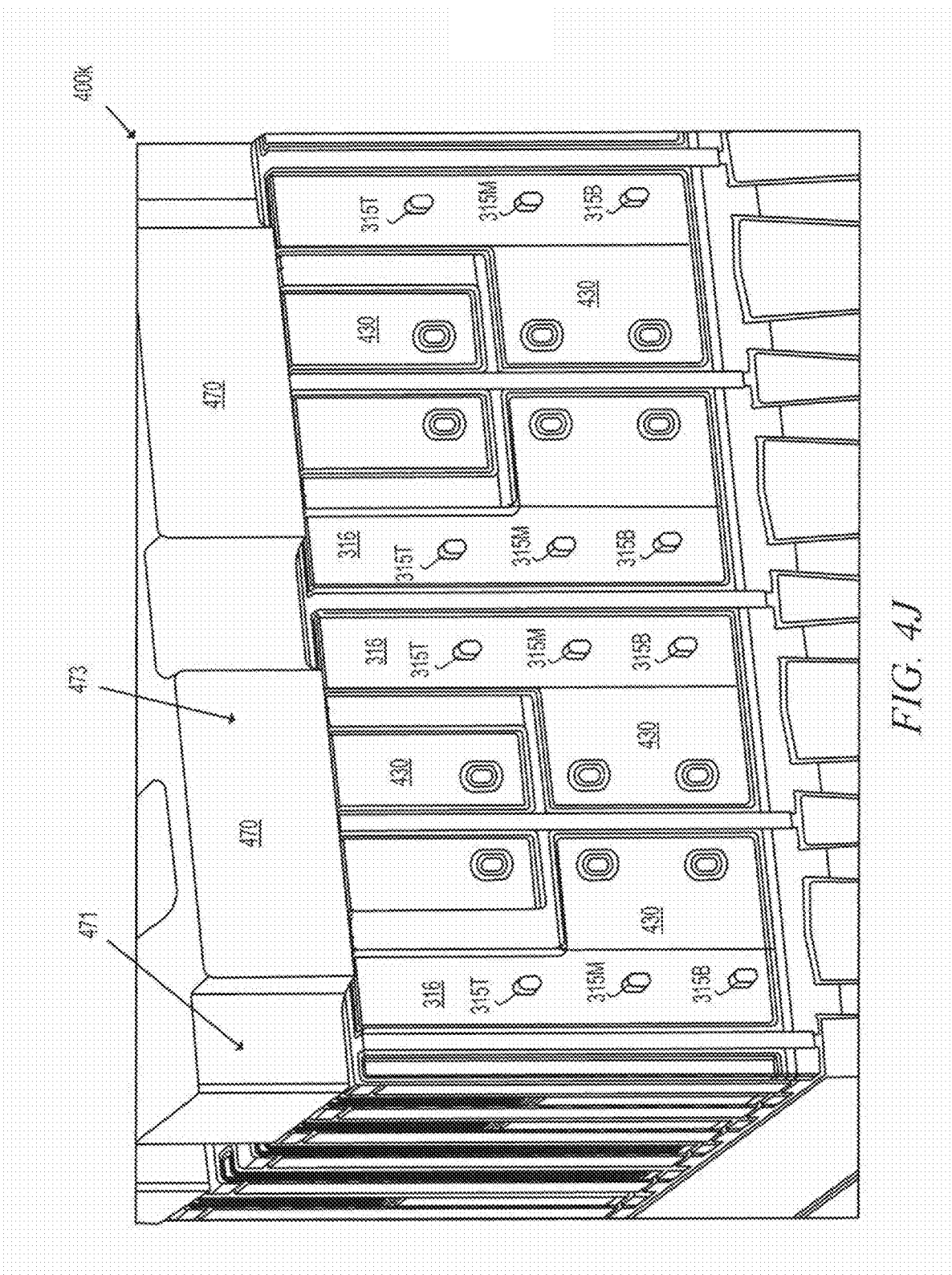
FIG. 4J is an example intermediate structure for forming a 3D SRAM according to embodiments of the disclosure.

Once the CONTROL gate portion is opened, the SiO or temporary fill material 430 within the control gate portion is removed. This can be done by a two-step removal process. In a first step, the CONTROL gate region can be anisotropically etched such that the fill 430 is removed from the full width of the CONTROL gate region down to the top nanowire 315T, and removed from beside the nanowires 315M and 315B down to the bottom, of the gate region. A second step of isotropic-follow-up etch is then performed to effectively remove any residual fill material from between the nanowires (i.e. in the vertical space between the middle and lower nanowires 315M and 315B) that will participate in the cross-couple. This two step process also ensures that the metalized wires 317M and 317B connecting to Vss and Vdd will still be protected by the fill material 430 as the isotropic etch component may only need to etch several nanometers (just enough to open areas between the nanowires that will be used only for the cross-couple). FIG. 4J shows a structure wherein the fill 430 is removed by the first step of anisotropic etch.

In this particular example, the gate metals 323 opened by the open pattern and removed temporary fill material are etched away by either plasma or atomic layer etch. The etching can be done far enough away from the metalized GAA wires so that the channel will not be disrupted. An alternative process can be executed that provides more room in the metal extension area for the CONTROL gate. The un-metalized wires are kept blocked and a small isolation trench is opened within the control gate and the isotropic portion of the fill removal clears out the wires to be metalized. This option benefits from the SRAM cell being sized larger in a north-to-south direction and having intended un-metalized wires be pushed up against the edge of the larger cell. The primary example herein provides complementary FET as a means for area scaling. Accordingly, all wires are initially metalized and then the unwanted metallization for the wires in the cross-couple are isolated for removing gate metallization.

Note that it may be sufficient to only remove high-k material 321 of the cross-couple (leaving the WFM). Thus another option includes removing the high-k deposition 321 from the cross-couple wires prior to depositing WFM, so that the channel materials are not disturbed since they could be deposited over and around the cross-couple wires. FIG. 4J shows a result of removing the high-k layers 321 and metal 323 (e.g., WFM) from the cross-couple nanowires 315.

The blocking pattern 470 over the cell can then be removed and the entire SiO fill or other temporary fill material from within the gate can be selectively removed without damaging the channel. This will expose the metal 323 in the PASS gate region. At this point, the gate can be filled with a liner and gate metal fill 319 (W or Al or Co or Co/CoAl alloy or Ru) which can then be recessed down in order to provide room for a dielectric cap in order to protect the gate region for when S/D bar processing is executed. The result is shown in FIG. 3, in this example the cross-couple does not require any contact up to any local interconnect layer as the local interconnection here is done internally within the gate between the un-metalized wires and the metalized wires that will connect to Vdd and Vss. The only contact up to metallization that would be required for this particular example cell would be word-line contact connecting to the PASS gate.

Note that the structure in FIG. 3 includes a gate region of a field effect transistor formed on the substrate. The gate region includes vertically stacked nanowires having longitudinal axes that extends parallel with a working surface of the substrate. A given stack of vertically stacked nanowires includes at least two nanowires vertically aligned in which a p-type nanowire and an n-type nanowire are spatially separated from each other vertically. The device also includes a step-shaped wiring structure formed within the gate region that electrically connects each nanowire to positions above the gate region. A first electrode has a step-shaped profile and connects to a first-level nanowire. Note that the CONTROL gate has an electrode with a step-shaped or "L" shaped profile that connects to a contact point vertically above the gate, and then the PASS gate electrode fits within a bend of the step-shaped electrode. Thus the wiring structure includes step-shaped electrodes with electrodes stacked on top of each other. Accordingly, complementary FET device can have vertically stacked nanowires and provide area scaling benefit.

Accordingly, techniques herein enable 3D PET devices by complimentary stacking different types of nanowires through the S/D bar and the gate over top of one another. Area scaling benefit of a complementary PET device is achieved in pad by enabling individually connect stacked NMOS and PMOS components to each specific wire, and also by methods of connecting these individual gate electrode portions to the word-line individually as well. Note that a composition herein of NMOS and PMOS electrode does not need to be configured serially, but can optionally be configured within a common gate structure which leads to further area scaling benefit in the east-to-west direction of a cell or device as well.

Techniques herein thus can be used to form the MOL and BEOL metallization layers and transfers to within the S/D region/bar in the front-end-of-line (FEOL) where there is ample room to accommodate the congestion. Having the electrodes stack over-top of one another in a stair-case fashion provides a configuration that enables true 3D logic devices and complementary FET 3D logic where NFET and PFET wires are stacked over-top of one another in order to realize significant area scaling benefit of such devices as they allow stacking of devices overtop of one another.

Thus, a cyclical process can be executed for three-dimensional device fabrication. In conventional cells, P-MOS and N-MOS regions take up a lot of substrate space being on different sides of a chip. With techniques herein, nanowires are essentially folded over top of each other. Instead of making a larger chip, the cell is grown upwardly making the chip taller. Thus techniques herein provide significant area scaling.

With growing a chip upwardly, there is a metallization challenge. With techniques herein, all of the initial metal contacts are formed within the S/D region and routed vertically. Some conventional NAND chips make use of a staircase contact configuration, but this is essentially a single staircase that extends horizontally for however many steps are formed, thus increasing a size of the chip. With techniques herein, however, staircase segments or step-shaped segments are formed on top of each other almost comparable to a tetris puzzle, so that initial metal routing is formed within a source-drain region of a cell, thereby realizing horizontal space savings.

Techniques herein can be useful for devices having two levels of nanowires, but techniques herein become significantly more beneficial when there are three or more levels/layers of nanowires to be connected. By executing several depositions, fully isotropic recess etches, and selective depositions, a step-shaped wiring configuration can be formed. Note that techniques herein can be used for stacking two or three or more channels. Fabrication techniques herein are repeated for creating more than three channels.

In some embodiments, adjacent cells can share connections. For example, power and drain contacts can be shared, and then the individual bits to each cell are still independent metal lines. Such a technique provides further scaling benefits because not as many metal fines are needed. For some types of devices, such as SRAM, sharing connections is very beneficial. By being able to share contacts, cell size can be halved relative to a cell size needed for separate (non-shared) contacts. By folding regions over each other there can be a 50% reduction in chip size, and then by sharing contacts there can be another approximately 50% reduction. Thus, techniques herein can reduce chip size by 75% with the same device density. By way of an exemplary benefit, with techniques herein, 9 SRAM cells can fit within an area required by 4 DRAM cells. For example, with Vdd and Vss sharing executed within the S/D bar, as opposed to sharing through connection to a metallization layer, entire metal tracks in the BEOL are not needed since sharing is done between cells through the S/D bar.

Note also that techniques herein applied to gate configuration provides a selective deposition processes within the gate. The result is ability to form line contacts to adjacent or individual bit lines.

In the claims below, any of the dependents limitations can depend torn any of the independent claims.

In the preceding description, specific details have been set forth, such as a particular geometry of a processing system and descriptions of various components and processes used therein. It should be understood, however, that techniques herein may be practiced in other embodiments that depart from these specific details, and that such details are for purposes of explanation and not limitation. Embodiments disclosed herein have been described with reference to the accompanying drawings. Similarly, for purposes of explanation, specific numbers, materials, and configurations have been set forth in order to provide a thorough understanding. Nevertheless, embodiments may be practiced without such specific details. Components having substantially the same functional constructions are denoted by like reference characters, and thus any redundant descriptions may be omitted.

Various techniques have beers described as multiple discrete operations to assist in understanding the various embodiments. The order of description should not be construed as to imply that these operations are necessarily order dependent. Indeed, these operations need not fee performed in the order of presentation. Operations described may be performed in a different order than the described embodiment. Various additional operations may be performed and/or described operations may be omitted in additional embodiments.

"Substrate" or "target substrate" as used herein generically refers to an object being processed in accordance with the invention. The substrate may include any material portion or structure of a device, particularly a semiconductor or other electronics device, and may, for example, be a base substrate structure, such as a semiconductor wafer, reticle, or a layer on or overlying a base substrate structure such as a thin film. Thus, substrate is not limited to any particular base structure, underlying layer or overlying layer, patterned or un-patterned, but rather, is contemplated to include any such layer or base structure, and any combination of layers and/or base structures. The description may reference particular types of substrates, but this is for illustrative purposes only.

Those skilled in the art will also understand that there can be many variations made to the operations of the techniques explained above while still achieving the same objectives of the invention. Such variations are intended to be covered by the scope of this disclosure. As such, the foregoing descriptions of embodiments of the invention are not intended to be limiting. Rather, any limitations to embodiments of the invention are presented in the following claims.

The invention claimed is:

1. A semiconductor device comprising:
   a substrate;
   a gate region of a field effect transistor formed on the substrate, the gate region including vertically stacked nanowires having longitudinal axes that extend parallel with a working surface of the substrate, a given stack of vertically stacked nanowires includes at least two nanowires vertically aligned in which a p-type nanowire and an n-type nanowire are spatially separated from each other vertically; and
   a step-shaped connecting structure formed within the gate region that electrically connects each nanowire to positions above the gate region, wherein a first gate electrode has a step-shaped profile and connects to a first-level nanowire.

2. The semiconductor device of claim 1, wherein the semiconductor device includes a barrier layer positioned between the at least two nanowires that are vertically aligned, wherein the barrier layer was selectively deposited on a first material without being deposited on a second material.

3. The semiconductor device of claim 2, wherein the barrier layer was initially selectively deposited on a temporary surface covering a lower nanowire and extending between the lower nanowire and an upper nanowire vertically aligned above the lower nanowire, without the barrier layer being deposited on the upper nanowire.

4. The semiconductor device of claim 1, wherein electrical contacts for each gate electrode above the gate region are adjacent to each other.

5. The semiconductor device of claim 1, wherein the step-shaped connecting structure includes a second gate electrode positioned above a horizontal segment of the first gate electrode and connected to a second-level nanowire.

6. The semiconductor device of claim 1, wherein the step-shaped connecting structure includes a second gate electrode connecting to a second-level nanowire, the second-level nanowire positioned above the first-level nanowire, the second gate electrode positioned above a horizontal surface of the first gate electrode, the first gate electrode and the second gate electrode being separated by one or more dielectric films.

7. The semiconductor device of claim 1, wherein each nanowire is spatially and electrically separated from each other.

8. The semiconductor device of claim 1, wherein the first gate electrode has a horizontally extending member and a vertically extending member; and
wherein the connecting structure includes a second gate electrode positioned above the horizontally extending member and adjacent to the vertically extending member, with the first gate electrode being electrically separated from the second gate electrode.

9. The semiconductor device of claim 1, wherein the p-type nanowire is an n-channel metal-oxide-semiconductor (NMOS) field-effect transistor; and
wherein the n-type nanowire is a p-channel metal-oxide-semiconductor (PMOS) field-effect transistor.

10. The semiconductor device of claim 9, wherein the n-type nanowire is positioned on a first nanowire level; and
wherein p-type nanowire is positioned on a second nanowire level above the first nanowire level.

11. The semiconductor device of claim 1, wherein at least one nanowire level includes two vertically stacked nanowires of a same semiconductor channel type.

12. The semiconductor device of claim 1, wherein the semiconductor device is an SRAM device.

13. The semiconductor device of claim 1, wherein the semiconductor device is a programmable logic device.

14. The semiconductor device of claim 1, wherein the semiconductor device is a random logic device.

15. The semiconductor device of claim 1, wherein the semiconductor device is a combination device having SRAM cells positioned over random logic cells.

16. A method of forming a semiconductor device, the method comprising: forming nanowires extending through a gate region of a field-effect transistor device;
forming a horizontal barrier layer between two vertically separated nanowires within the gate region, the gate region having a temporary fill material covering a first-level nanowire, the temporary fill material having a horizontal surface extending between the first-level nanowire and a second-level nanowire, the second-level nanowire positioned above the first level-nanowire and vertically aligned with the first-level nanowire, the horizontal barrier being formed by selectively depositing barrier material on the temporary surface without depositing barrier material on the second-level nanowire;
forming a vertical electrode barrier extending to the horizontal barrier; and
forming a first gate electrode and a second gate electrode within the gate region, with each gate electrode electrically connecting a nanowire to a contact location above the gate region, the first gate electrode having a step-shaped profile, the first and second gate electrode being separated from each other by at least the horizontal barrier and the vertical electrode barrier.

17. The method of claim 16, wherein forming the nanowires includes forming an n-type nanowire vertically above a corresponding p-type nanowire.

18. The method of claim 16, wherein forming the nanowires includes forming an p-type nanowire vertically above a corresponding n-type nanowire.

19. The method of claim 16, wherein forming nanowires includes forming, fins having alternating layers of a first material and a second material; and
selectively removing the first material such that the second material remains as nanowires.

20. A method of forming a semiconductor device, the method comprising:
forming a gate region having a vertical stack of nanowires that includes at least two nanowires with longitudinal axes oriented horizontally and with the nanowires being spaced apart from each other and aligned vertically;
executing a process sequence of depositing temporary fill material in the gate region;
recessing the temporary fill material to a location in between vertically stacked nanowires;
forming a horizontal barrier material by selectively depositing on the temporary fill material without depositing on uncovered nanowires;
forming vertical barriers;
selectively metallizing nanowires; and
forming first and second gate electrodes by depositing metal within spaces defined by the horizontal barrier and vertical barriers.

* * * * *